(12) United States Patent
Hong et al.

(10) Patent No.: US 6,383,865 B2
(45) Date of Patent: May 7, 2002

(54) METHOD FOR FABRICATING A CAPACITOR IN A SEMICONDUCTOR DEVICE

(75) Inventors: Kwon Hong; Hyung-Bok Choi, both of Ichon-shi (KR)

(73) Assignee: Hynix Semiconductor Inc., Ichon-shi (KR)

(*) Notice: Subject to any disclaimer, the term of this patent is extended or adjusted under 35 U.S.C. 154(b) by 0 days.

(21) Appl. No.: 09/886,389

(22) Filed: Jun. 22, 2001

(30) Foreign Application Priority Data

Jun. 28, 2000 (KR) ........................... 2000-36046

(51) Int. Cl.[7] ........................... H01L 21/8242
(52) U.S. Cl. ........................... 438/243; 438/396
(58) Field of Search ................. 438/243–245, 438/250, 253, 254, 386, 387, 388, 396, 397

(56) References Cited

U.S. PATENT DOCUMENTS 6,255,187 B1 * 7/2001 Horii ........................... 438/396

6,294,425 B1 * 9/2001 Hideki ........................... 438/253

* cited by examiner

*Primary Examiner*—David Nelms
*Assistant Examiner*—David Vu
(74) *Attorney, Agent, or Firm*—Jacobson Holman, PLLC

(57) ABSTRACT

A method for fabricating a capacitor of a semiconductor device, comprising the steps of forming a seed layer over a semiconductor substrate, and forming multiple oxide layers on the seed layer, wherein wet etching of the multiple oxide layers decreases as the layers go up. A first opening is formed by exposing the seed layer by selectively dry etching the multiple oxide layer. A second opening is formed by wet etching the lateral surface of the first opening where the width of the first opening is expanded, wherein the lower part of the second opening is larger than the upper part. A bottom electrode is formed on the seed layer exposed at the bottom of the second opening, whereby the bottom electrode has an identical shape with the second opening, and the bottom electrode is formed with the ECD (Electro-Chemical Deposition) technique. The seed layer is exposed by removing the multiple oxide layer and then the exposed seed layer is removed. A dielectric layer is formed on the bottom electrode and a top electrode is formed on the dielectric layer.

13 Claims, 3 Drawing Sheets

METHOD FOR FABRICATING A CAPACITOR IN A SEMICONDUCTOR DEVICE

BACKGROUND OF THE INVENTION

1. Field of the Invention

The present invention relates to a method for manufacturing a capacitor in a semiconductor device; and, more particularly, a method for fabricating a capacitor having a bottom electrode, of which an upper part is smaller than a lower part.

2. Description of the Prior Art

An ECD (Electro-Chemical Deposition) technique is used to deposit the Pt layer for a bottom electrode of a capacitor, of which the size is decreased according to the increase of the integration density of the semiconductor device. To form the Pt layer for the bottom electrode, a Pt seed layer is formed on a semiconductor substrate. A predetermined lower structure is also formed, and an oxide layer pattern having an opening exposing the Pt seed layer is formed. The Pt layer is deposited on the Pt seed layer exposed in the opening.

At this time, a profile of a bottom electrode is determined by a profile of the opening in the oxide pattern formed by dry etch. The opening has the profile of the lower part. The lower part of the opening is relatively smaller than the upper part, by the characteristic of dry etch. As as shown in FIG. 1, the lower part of the bottom electrode is smaller than the upper part, according to the profile of the opening. Thereby, the electrical characteristics of the capacitor are deteriorated, because the step coverage of the dielectric layer and the top electrode, deposited on the bottom electrode, is poor.

SUMMARY OF THE INVENTION

It is, therefore, an object of the present invention to provide a method for fabricating a capacitor by improving an electrical characteristic in a semiconductor device.

In accordance with an aspect of the present invention, there is provided a method for fabricating a capacitor of a semiconductor device. The method includes the steps of forming a seed layer over a semiconductor substrate and forming multiple oxide layers on the seed layer, wherein a wet etching rate of the multiple oxide layers decreases as the layers go up.

There is also a step of forming a first opening for exposing the seed layer by selectively dry etching the multiple oxide layer. A second opening is formed by wet etching the lateral surface of the first opening where the width of the first opening is expanded. The lower part of the second opening is larger than the upper part.

The method further includes a step of forming a bottom electrode on the seed layer when it is exposed at the bottom of the second opening. The bottom electrode has an identical shape as the second opening, and the bottom electrode is formed with an ECD (Electro-Chemical Deposition) technique.

The seed layer is formed by removing the multiple oxide layers by wet etching. The seed layer is removed by dry etching. A dielectric layer is formed on the bottom electrode and a top electrode is formed on the dielectric layer.

BRIEF DESCRIPTION OF THE DRAWINGS

The above and other objects and features of the present invention will become apparent from the following description of preferred embodiments taken in conjunction with the accompanying drawings, in which.

DESCRIPTION OF THE INVENTION

Hereinafter, a method for fabricating a capacitor of a semiconductor device according to the present invention will be described in detail referring to the accompanying drawings.

Figure 1:
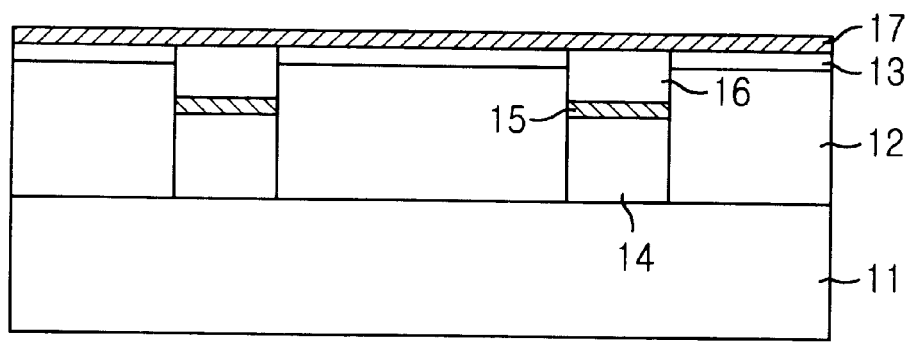
FIGS. 1 to 5 are cross-sectional views showing a capacitor fabricating process of a semiconductor device according to the present invention.

As shown in FIG. 1, an insulating layer 12 and a reflecting protection layer 13 are formed on a semiconductor substrate 11, on which a predetermined structure has been formed. The reflecting protection layer 13 is formed with a material of which the etching is selectivity higher than the insulating layer 12. The insulating layer 12 is formed with an oxide layer and the reflecting protection layer 13 is formed with an oxide-nitride layer (SiON) according to the preferred embodiment of the present invention.

Next, a contact hole, exposing a predetermined region of the semiconductor, is formed by selectively etching the reflecting protection layer 13 and the insulating layer 12. Therefore, a polysilicon layer is formed on the entire structure, at thickness of 500 Å to 3000 Å, and then a polysilicon plug 14 is formed through a blanket etching process until the polysilicon remains only in the contact hole at a depth of 500 Å to 2000 Å from the upper surface of the reflection protecting layer 13.

A Ti layer is formed on the entire structure, including the polysilicon plug 14, at thickness of 100 Å to 300 Å. A thermal treatment is performed to form $TiSi_x$ layer 15 on the polysilicon plug 14 by the reaction between the surface of the polysilicon plug 14 and the Ti layer. Thereafter, the Ti layer remaining on the reflecting protection layer 13 is removed by a wet etching process.

A diffusion barrier layer 16 is formed on the entire structure for completely burying the contact hole. The diffusion barrier layer 16 is formed with any one of the following TiN layer, TiSiN layer, TiAlN layer, TaSiN layer or TaAlN layer. A CMP process is performed until the upper surface of the reflecting prevention layer is revealed, thereby the diffusion barrier layer 16 remains only on the $TiSi_x$ layer 15 in the contact hole.

A seed layer 17 for forming a Pt layer is formed on the reflecting protection layer 13 and the diffusion barrier layer 16. The seed layer 17 is formed with one of the following Pt, Ru, Ir, Os, W, Mo, Co, Ni, Au or Ag at thickness of 50 Å to 1000 Å.

Figure 2:
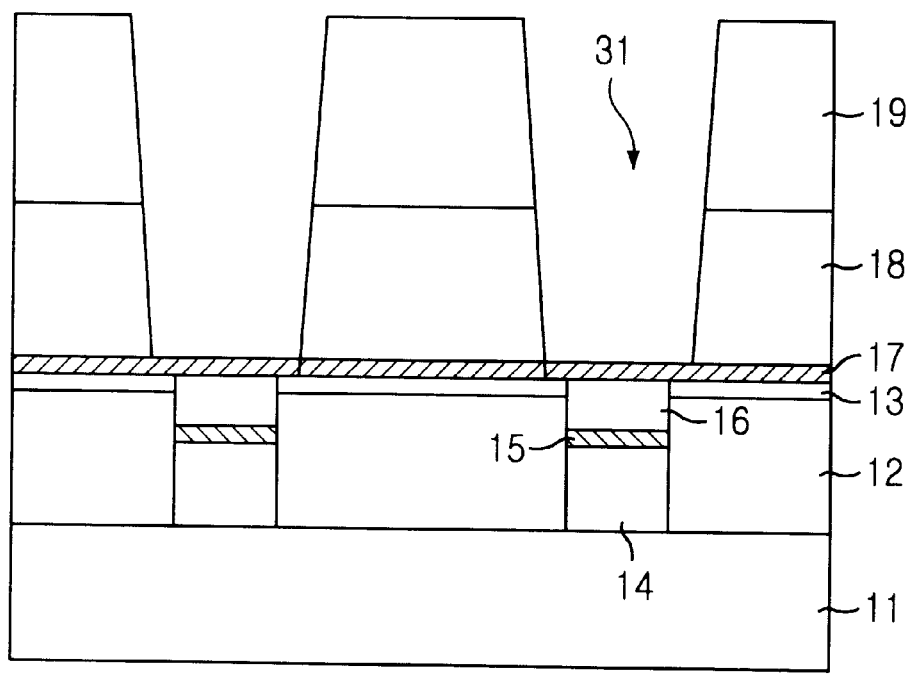

As shown in FIG. 2, a first oxide layer 18 and a second oxide layer 19 are successively formed on the seed layer 17. Even if the oxide layer is formed with double steps according to the preferred embodiment of the present invention, the oxide layer can be formed with multiple layers, such as triple layers and so on.

In the multiple oxide layers, the wet etching rate of each layer decreases as the layers go up. Namely, in the case of forming the double oxide layers according to the preferred embodiment of the present invention, the wet etching rate of the first oxide layer 18 is faster than that of the second oxide layer 19.

In order to decrease the wet etching rates of the multiple oxide layers, as the layers go up, two methods of forming the multiple oxide layers may be used. One method is to decrease the dopant concentration of the multiple oxide layers, as the layers go up. The other method is to increase the deposition temperature of the multiple oxide layers. More specifically, each layer is doped with an identical dopant, as the layers go up. The multiple oxide layers are doped with at least one of the following B, P, As or Ga. The total thickness of the multiple oxide layers are 500 Å to 20000 Å in the preferred embodiment of the present invention.

A first opening 31 exposing the seed layer 17 is formed by selectively dry-etching.

Figure 3:
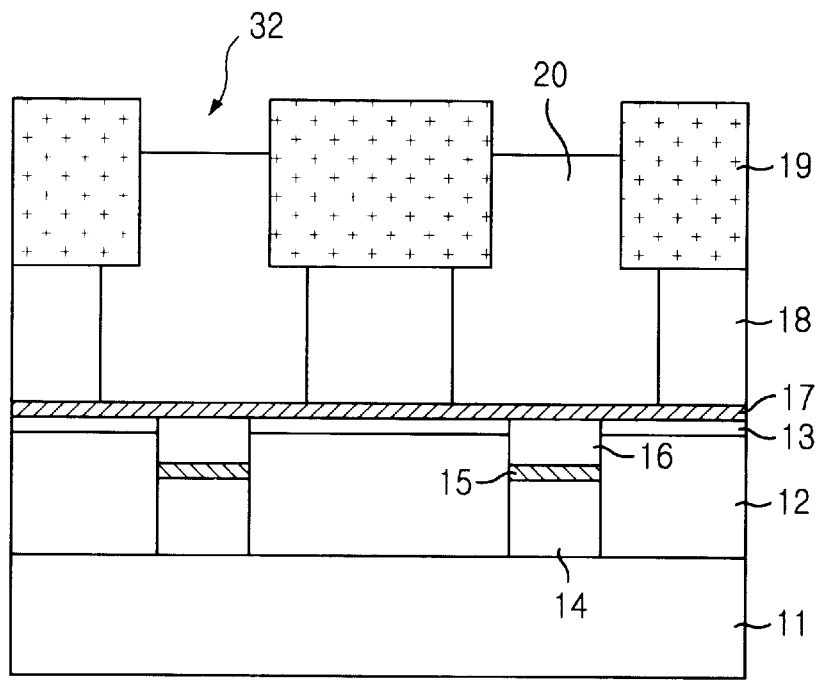

As shown in FIG. 3, the second oxide layer 19 and the first oxide layer 18 are etched, by using wet etchant, to form a second opening 32, which is larger than the first opening. The first oxide layer 18 is etched more rapidly than the second oxide layer 19 in the etching process, because the etch rate of the first oxide layer 18 is faster than that of the second oxide layer 19. Thereby, it is possible to obtain the second opening 32, of which the lower part is larger than the upper part.

The second oxide layer 19 and the first oxide layer 18 are etched with a mixed solution of HF and $H_2O$, or a mixed solution of $NH_4F$ and $H_2O$, at temperature of 4° C. to 80° C., for 1 second to 3600 seconds, according to the preferred embodiment of the present invention. The volume of $H_2O$ is less than 1000 times the volume of the HF solution, in the mixed solution of HF and $H_2O$, and the volume of NH4F is less than 500 times the volume of the mixed solution of $NH_4F$ and HF.

Subsequently, a first metal layer is formed on the seed layer 17 by using an ECD technique, and the first metal layer is completed with the wet etching of the first oxide layer 18 and the second oxide layer 19. The first metal layer is formed with either Ru, Ir, Os, W, Mo, Co, Ni, Au or Ag as a layer at a condition with a current density of 0.1 mA/cm$^2$ to 10 mA/cm$^2$.

It is possible to form the bottom electrode, of which lower part is larger than the upper part, by forming the first metal layer in the second opening 32, of which lower part is also larger than the upper part. The bottom electrode of the capacitor fabricated according to the present invention is shown in FIG. 3.

Figure 4:
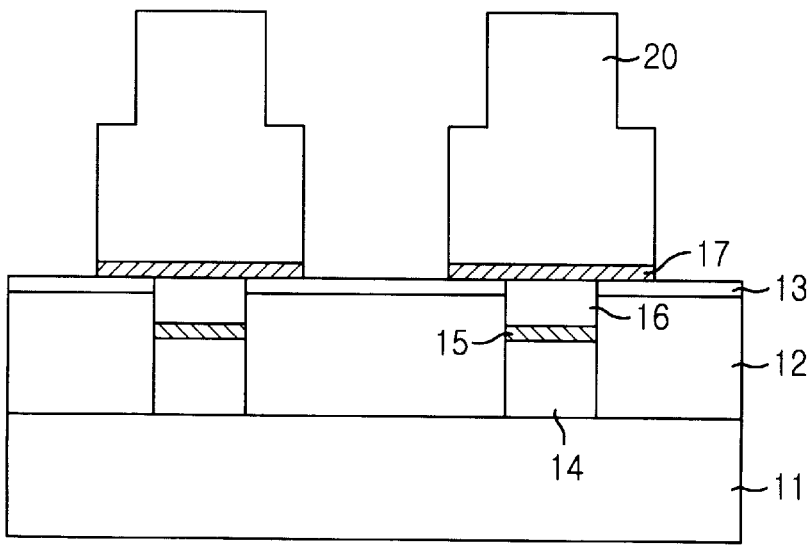

As described in FIG. 4, the seed layer 17 is exposed by removing the multiple oxide layers and the exposed seed layer 17 is removed for insulation between the bottom electrodes.

Figure 5:
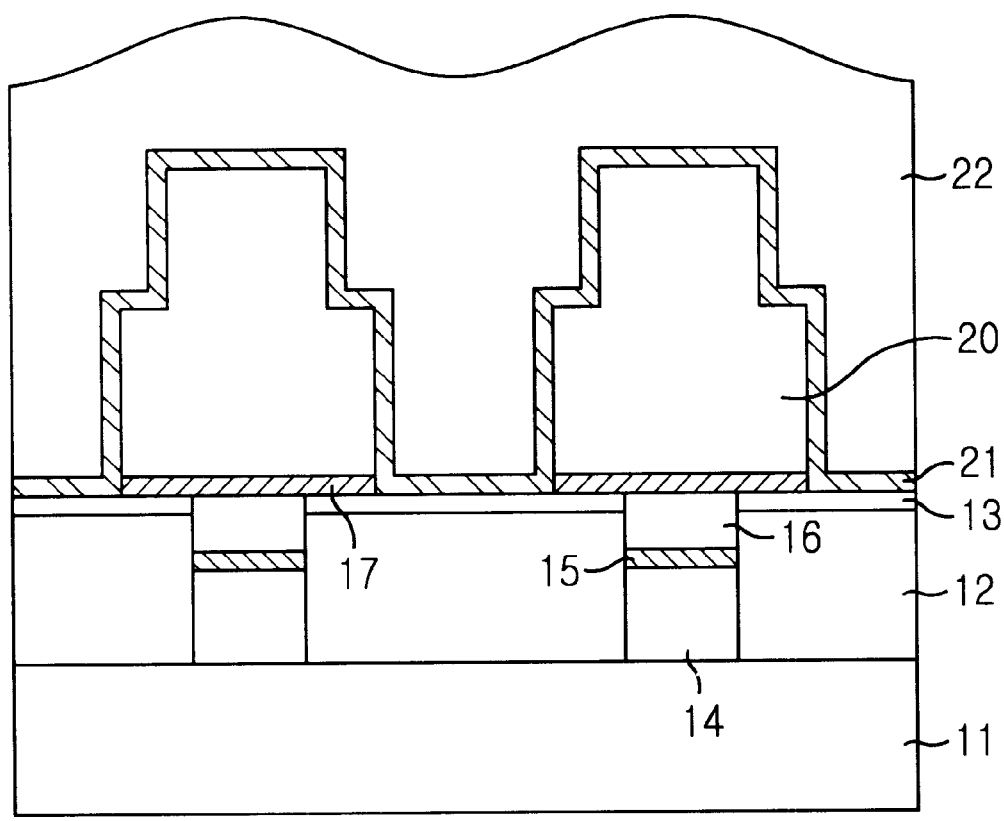

As described in FIG. 5, a dielectric layer 21 is formed on the entire structure including the bottom electrode, and a rapid thermal annealing process is implemented for improving the dielectric characteristic. A second metal layer, e.g., a Pt layer, is formed on the dielectric layer 21 and a top electrode 22 is formed by patterning the second metal layer. The dielectric layer 21 is formed with a (Ba, Sr)TiO$_3$ (BST) layer at temperature of 300° C. to 600° C., to thickness of 150 to 500.

Also, the rapid annealing process is implemented at a nitrogen gas atmosphere with a temperature of 500° C. to 700° C. for 30 seconds to 180 seconds in the ambient of nitrogen. The second metal layer is formed by using a CVD technique or a sputtering technique.

As described in the above, when the dielectric layer and the top electrode are formed on the bottom electrode according to the present invention, the characteristic of the step coverage may be improved and the electrical characteristic of the device may be improved.

While the present invention has been described with respect to the particular embodiments, it will be apparent to those skilled in the art that various changes and modifications may be made without departing from the spirit and scope of the invention as defined in the following claims.

What is claimed is:

1. A method for fabricating a capacitor of a semiconductor device, comprising the steps of:

forming a seed layer over a semiconductor substrate;

forming multiple oxide layers on the seed layer, wherein a wet etching rate of the multiple oxide layers decreases as the layers go up;

forming a first opening, having a lateral surface and a width, for exposing the seed layer by selectively dry etching the multiple oxide layers;

forming a second opening, having a lower part and an upper part, by wet etching the lateral surface of the first opening where the width of the first opening is expanded, wherein the lower part of the second opening is larger than the upper part;

forming a bottom electrode on the seed layer exposed at the bottom of the second opening, whereby the bottom electrode has an identical shape as the second opening, wherein the bottom electrode is formed with an ECD (Electro-Chemical Deposition) technique;

exposing the seed layer by removing the multiple oxide layers by wet etching;

removing the seed layer by dry etching;

forming a dielectric layer on the bottom electrode; and forming a top electrode on the dielectric layer.

2. The method as recited in claim 1, wherein the seed layer is formed with a material selected from the group consisting of Pt, Ru, Ir, Os, W, Mo, Co, Ni, Au and Ag layer.

3. The method as recited in claim 1, wherein the bottom electrode is formed with a material selected from the group consisting of Pt, Ru, Ir, Os, W, Mo, Co, Ni, Au and Ag layer.

4. The method as recited in claim 1, wherein the bottom electrode is formed at a current density of 0.1 mA/cm$^2$ to 10 mA/cm$^2$.

5. The method as recited in claim 1, wherein the multiple oxide layers are formed step by step by decreasing concentration of dopant in each layer of the multiple oxide layers.

6. The method as recited in claim 5, wherein the dopant is a material selected from the group consisting of B, P, As and Ga.

7. The method as recited in claim 1, wherein the wet etching is performed at a temperature of 4° C. to 80° C. for 1 second to 3600 seconds.

8. The method as recited in claim 7, wherein the wet etching is performed by using HF contained solution.

9. The method as recited in claim 8, wherein the wet etching is performed by using mixed solution of the HF solution and $H_2O$, wherein the volume of $H_2O$ is less than 1000 times of the volume of the HF solution.

10. The method as recited in claim 9, wherein the wet etching process is performed by using a mixed solution of the $NH_4F$ solution and HF, wherein the volume of $NH_4F$ is less than 500 times of the volume of the $NH_4F$/HF solution.

11. The method as recited in claim 1, wherein the multiple oxide layers are formed by increasing, step by step, depositing temperature of each layer of the multiple oxide layers, wherein each layer of the multiple oxide layers have an identical dopant concentration.

12. The method as recited in claim 11, wherein the dopant is a material selected from the group consisting of B, P, As and Ga.

13. The method as recited in claim 12, wherein the wet etching is performed at a temperature of 4° C. to 80° C. for 1 second to 80 seconds.

* * * * *